(12) United States Patent
Hata et al.

(10) Patent No.: US 9,391,242 B2
(45) Date of Patent: Jul. 12, 2016

(54) LIGHT-EMITTING DEVICE

(71) Applicant: SHARP KABUSHIKI KAISHA, Osaka-shi, Osaka (JP)

(72) Inventors: Toshio Hata, Osaka (JP); Yuhsuke Fujita, Osaka (JP); Kenichi Akamatsu, Osaka (JP)

(73) Assignee: SHARP KABUSHIKI KAISHA, Osaka-shi, Osaka (JP)

( * ) Notice: Subject to any disclaimer, the term of this patent is extended or adjusted under 35 U.S.C. 154(b) by 0 days.

(21) Appl. No.: 14/406,331

(22) PCT Filed: Apr. 26, 2013

(86) PCT No.: PCT/JP2013/002871
§ 371 (c)(1),
(2) Date: Dec. 8, 2014

(87) PCT Pub. No.: WO2013/186978
PCT Pub. Date: Dec. 19, 2013

(65) Prior Publication Data
US 2015/0137161 A1    May 21, 2015

(30) Foreign Application Priority Data

Jun. 15, 2012 (JP) ................. 2012-136435

(51) Int. Cl.
*H01L 33/62* (2010.01)
*H01L 33/48* (2010.01)
(Continued)

(52) U.S. Cl.
CPC ............ *H01L 33/486* (2013.01); *H01L 25/167* (2013.01); *H01L 27/15* (2013.01);
(Continued)

(58) Field of Classification Search
CPC ......... H01L 27/15; H01L 33/00; H01L 33/44; H01L 33/48; H01L 33/486; H01L 33/50; H01L 33/505; H01L 33/507; H01L 33/52; H01L 33/54; H01L 33/62
See application file for complete search history.

(56) References Cited

U.S. PATENT DOCUMENTS 3,810,148 A * 5/1974 Karsten .............. A63B 71/0605
250/221
2011/0001156 A1 * 1/2011 Matsuda et al. ................ 257/98
(Continued)

FOREIGN PATENT DOCUMENTS

JP 63-213301 9/1988
JP 5-25749 4/1993
(Continued)

OTHER PUBLICATIONS

Japanese Official Action dated Jul. 14, 2015 issued in Japanese Patent Application No. 2014-520879 and partial English translation.
International Search Report for PCT/JP2013/002871 mailed Jun. 4, 2013.
Written Opinion of the International Searching Authority for PCT/JP2013/002871 mailed Jun. 4, 2013.

*Primary Examiner* — Allen Parker
*Assistant Examiner* — Gustavo Ramallo
(74) *Attorney, Agent, or Firm* — Nixon & Vanderhye, P.C.

(57) ABSTRACT

A surface mounted light emitting device having superior reliability with a focus on low cost producibility, in which a protective element can be formed without lowering the efficiency of light emission from a light emitting element, is provided.

Since, for example, a printed resistance 16, as a protective element, is formed on at least the top surface side, the back surface side, or the inside of an insulating film 2 and, for example, the printed resistance 16, as a protective element, is formed on the rear surface side of the installation surface of a light emitting element 11, light emitted from the light emitting element 11 is not obstructed due to light blocking, light absorption or the like by, for example, the printed resistance 16, as a protective element.

20 Claims, 7 Drawing Sheets

(51) Int. Cl.
*H01L 25/16* (2006.01)
*H05K 1/16* (2006.01)
*H01L 27/15* (2006.01)
*H01L 33/36* (2010.01)
*H01L 33/50* (2010.01)
*H01L 33/54* (2010.01)
*H01L 33/56* (2010.01)

(52) U.S. Cl.
CPC ............ *H01L 33/36* (2013.01); *H01L 33/505* (2013.01); *H01L 33/54* (2013.01); *H01L 33/56* (2013.01); *H05K 1/167* (2013.01); *H01L 33/62* (2013.01); *H01L 2224/48091* (2013.01); *H01L 2224/48227* (2013.01); *H01L 2224/48228* (2013.01); *H01L 2224/73265* (2013.01); *H05K 2201/09363* (2013.01); *H05K 2201/10106* (2013.01)

(56) References Cited

U.S. PATENT DOCUMENTS

| 2011/0186901 A1* | 8/2011 | Ushiyama | H01L 33/48 257/99 |
| 2013/0119426 A1* | 5/2013 | Katoh | H01L 33/486 257/98 |
| 2014/0036205 A1* | 2/2014 | Sugiura | H01L 25/0753 349/69 |

FOREIGN PATENT DOCUMENTS

| JP | 2003-023221 | 1/2003 |
| JP | 2009-105198 | 5/2009 |
| JP | 2011-014695 | 1/2011 |
| WO | WO 2012/011363 | 1/2012 |

* cited by examiner

Fig.2
(a)
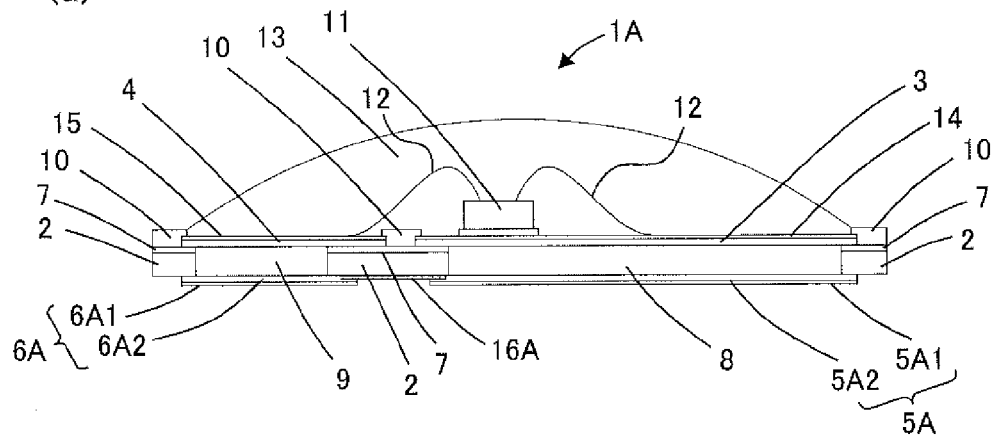
(b)
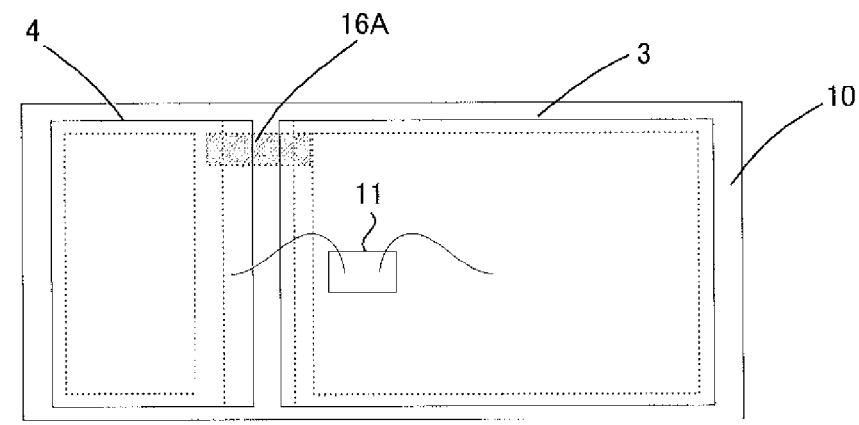
(c)
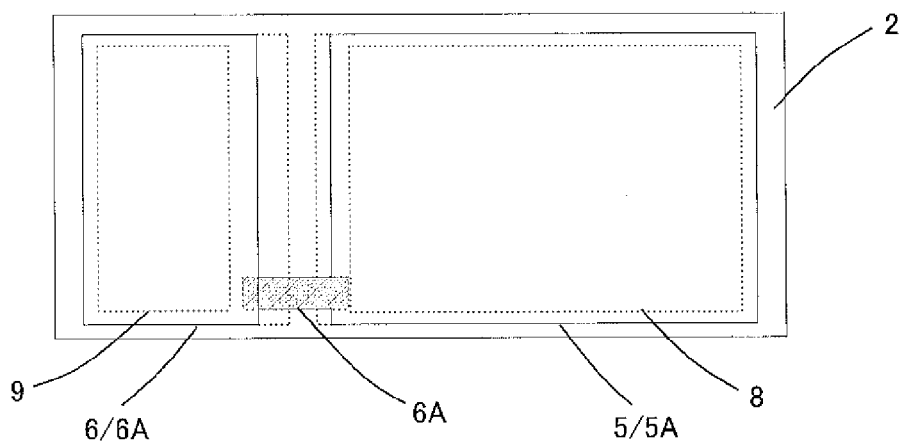

Fig.5
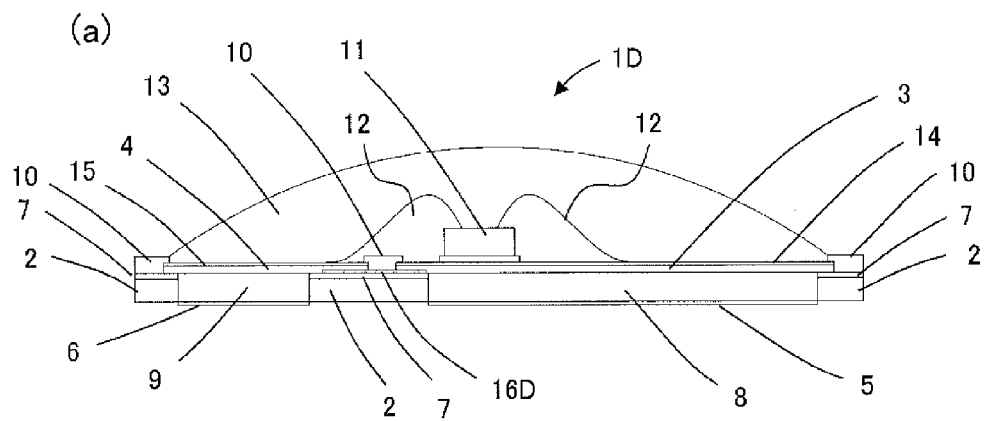
(a)
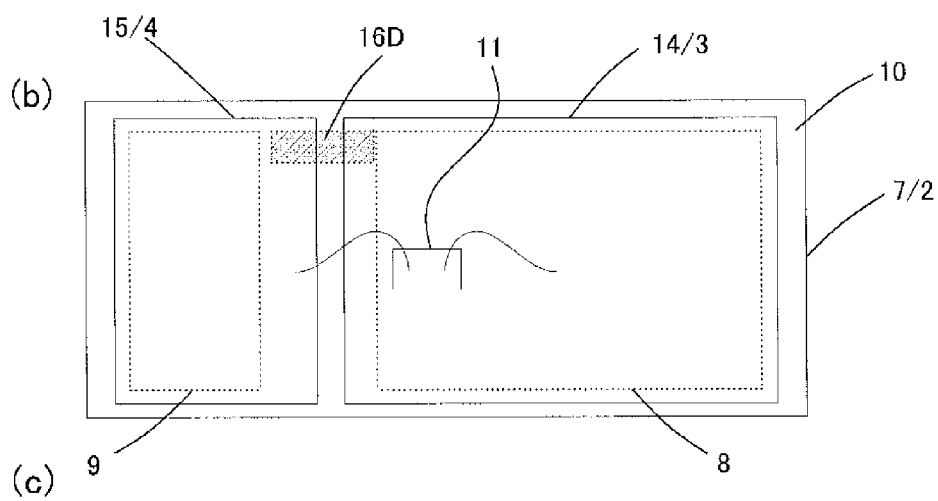
(b)
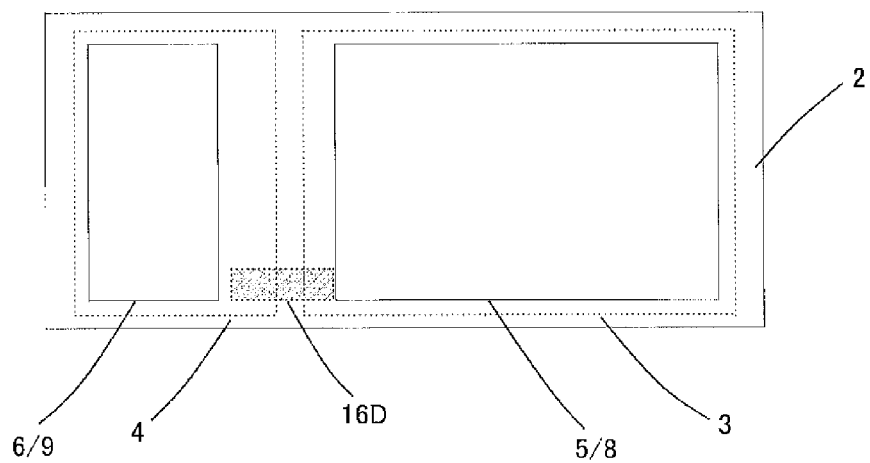
(c)

LIGHT-EMITTING DEVICE

This application is the U.S. national phase of International Application No. PCT/JP2013/002871 filed 26 Apr. 2013 which designated the U.S. and claims priority to Japanese Patent Application No. 2012-136435 filed 15 Jun. 2012, the entire contents of each of which are hereby incorporated by reference.

TECHNICAL FIELD

The present invention relates to a surface mounted light emitting device and a manufacturing method thereof, and particularly to a surface mounted light emitting device focused on low cost producibility.

BACKGROUND ART

Conventionally, for example, light emitting devices disclosed in the following Patent Literature 1 and Patent Literature 2 have been available as surface mounted light emitting devices having a light emitting element such as a light emitting diode (LED) installed on a substrate surface and sealed with a transparent resin.

FIG. 7 is a longitudinal sectional view showing an example of a configuration of a conventional LED illumination module disclosed in Patent Literature 1.

As shown in FIG. 7, an LED illumination module 100 comprises a flexible wiring substrate made by forming a circuit wiring 102 on a flexible substrate 101, forming a flexible substrate 104 thereon with an adhesive 103 interposed therebetween, and forming a flexible reflection layer thereon for reflecting light from an LED die 105.

The module has a structure in which a heat spreader 107 penetrating the flexible wiring substrates 101 and 104 is provided, the LED die 105 is installed on the heat spreader 107, and an electrode on the top surface side of the LED die 105 is connected to an exposed surface of the circuit wiring 102 through an opening provided on the flexible substrate 104 with a wire 108 by wire bonding.

FIG. 8 is a longitudinal sectional view showing an example of a configuration of a conventional LED illumination module disclosed in Patent Literature 2.

As shown in FIG. 8, an LED illumination module 200 has an electrical insulator 201 (201a: adhesive layer, 201b: base material, and 201c: white insulator) with a total reflectance of light from at least the first surface side (wavelength 450 nm) of 80% or greater, via holes 202-204 that penetrate the electrical insulator 201, wiring patterns 205-207 provided on the second surface side of the electrical insulator 201, a wiring pattern 208 provided in the via hole 202, a wiring pattern 209 provided in the via hole 203, and a metal filled section 210 provided in the via hole 204.

An LED chip 211 is bonded to the first surface side of the electrical insulator 201 and the surface of the metal filled section 210 by die bonding. In addition, each electrode of the LED chip 211 is bonded to the wiring patterns 208 and 209 with a wire 212 by wire bonding. The LED chip 211 is then sealed by a resin with a resin sealing material 213.

CITATION LIST

Patent Literature

Patent Literature 1: Japanese Laid-Open Publication No. 2005-136224

Patent Literature 2: Japanese Laid-Open Publication No. 2012-33855

SUMMARY OF INVENTION

Technical Problem

In recent years, light emitting devices such as LEDs have undergone progress resulting in higher luminance and are utilized in a variety of fields, such as in a display device, illumination device, and back lighting device of an LCD television or an LCD monitor, with lower power consumption, higher impact resistance, and better longevity as the characteristics thereof. While the range of application and expectation for light emitting devices have expanded, there is an increasing demand for lower cost in light emitting devices. For example, the need for lower cost of LED dice in a light emitting device as well as lower implementation cost thereof has increased.

In the above-described conventional light emitting device 100 disclosed in Patent Literature 1, a structure for externally drawing out the circuit wiring 102, in accordance with the form of application of the light emitting device 100, would be separately required. In addition, since such a light emitting device has a structure that sandwiches the circuit wiring 102 between the two layers of the flexible substrates 101 and 104 on the top and bottom with the adhesive 103 interposed therebetween, it is necessary to cut the flexible wiring substrates 101 and 104 with a dedicated processing device in order to cut out and use a required number of light emitting devices from the flexible wiring substrates 101 and 104. Thus, such a structure is considered unsuited for mass production at low cost.

In this case, the heat spreader 107 is present between one of the circuit wirings 102 and the other circuit wiring 102 bonded by wiring bonding from the LED die 105. Thus, it is difficult to form a protective element between one of the circuit wirings 102 and the other circuit wiring 102 in this structure.

Similar to the case of the above-described conventional light emitting device 100, the above-described conventional light emitting device disclosed in Patent Literature 2 is also considered as having a structure in which it is difficult to form a protective element.

That is, since the power-supplying wiring pattern 205 or the wiring pattern 209 provided in the via hole 203, the power-supplying wiring pattern 206 or the wiring pattern 208 provided in the via hole 202, and the heat-dissipating wiring pattern 207 or the heat dissipating wiring pattern 210 provided in the via hole 204 are not electrically connected, the heat-dissipating wiring pattern 210 is present between the wiring patterns 208 and 209 and the heat dissipating wiring pattern 207 is present between one of the power supplying wiring patterns 205 and the other power supplying wiring pattern 206. Thus, the light emitting device disclosed in Patent Literature 2 has a structure in which it is difficult to form a protective element between one of the power supplying wiring patterns 205 and the other power supplying wiring pattern 206.

Meanwhile, cases of the aforementioned Patent Literatures 1 and 2 have issues in that a protective element would block and absorb emitted light from an installed light emitting element which lowers the efficiency of light emission when the protective element is disposed on the surface which is the side a light emitting element is installed.

The present invention solves the above-described conventional issues. The objective of the present invention is to provide a surface mounted light emitting device having superior reliability with a focus on low cost producibility, and allows a protective element to be formed without lowering the efficiency of light emission from a light emitting element.

Solution to Problem

A light emitting device according to the present invention, comprising two conductive regions provided to correspond to ± polarity on an insulation film, a light emitting element installed on a top surface side of the two conductive regions and electrically connected to the two conductive regions, and a protective element connected in parallel to the light emitting element is provided, where the protective element is on a rear surface side of an installation surface of the light emitting element and is formed on at least one of a top surface side, a back surface side, and an inside of the insulation film, thereby achieving the objective described above.

Preferably, in the light emitting device according to the present invention, the protective element is comprised of a printed resistance or a thin film resistance.

Still preferably, in the light emitting device according to the present invention, the protective element is formed on a top surface of the insulation film.

Still preferably, in the light emitting device according to the present invention, the protective element is formed on an adhesive layer formed on the insulation film.

Still preferably, in the light emitting element according to the present invention, the protective element is formed on a back surface of the insulation film.

Still preferably, in the light emitting element according to the present invention, the protective element is electrically connected to a pair of terminal sections that are electrically connected to the two conductive regions.

Still preferably, in the light emitting device according to the present invention, the protective element is formed between the pair of terminal sections, including on top of the pair of terminal sections.

Still preferably, in the light emitting device according to the present invention, each of the pair of terminal sections is formed on each of both ends of the protective element to protect the protective element.

Still preferably, in the light emitting device according to the present invention, the light emitting element is covered by at least one of a translucent resin layer and a phosphor-containing resin layer formed on the top surface side of the insulation film, and the protective element is formed on the top surface side or back surface side of the insulation film and on an outer side in a plan view of at least one of the phosphor-containing resin layer and the translucent resin layer.

Still preferably, in the light emitting device according to the present invention, a surface of at least one of the translucent resin layer and the phosphor-containing resin layer is formed in a dome shape.

Still preferably, in the light emitting device according to the present invention, the printed resistance is formed by screen printing a paste containing a resistive component.

Still preferably, in the light emitting device according to the present invention, the paste is comprised of ruthenium oxide, a solidifying agent, a resin, and a solvent.

Still preferably, in the light emitting device according to the present invention, the two conductive regions are spaced and insulated from each other while step sections in a plan view are provided on opposing sides of the two conductive regions.

Still preferably, in the light emitting device according to the present invention, the step sections have at least one of concave-convex shapes in a plan view for preventing a device from folding and L/L shapes in a plan view for preventing a device from folding.

Still preferably, in the light emitting device according to the present invention, the concave-convex shapes in a plan view are formed so that opposing sides of the two conductive regions fit while being spaced at a predetermined distance.

Still preferably, in the light emitting device according to the present invention, the L/L shapes in a plan view are formed so that opposing sides of the two conductive regions enter each other while being spaced at a predetermined distance.

With the configuration described above, the functions of the present invention will be described hereinafter.

The present invention has two conductive regions provided to correspond to ± polarity on an insulation film, a light emitting element installed on the top surface side of the two conductive regions and electrically connected to the two conductive regions, and a protective element connected in parallel to the light emitting element. The protective element is on the rear surface side of the installation surface of the light emitting element, and the protective element is formed at least on the top surface side, on the back surface side, or inside of the insulation film.

In this manner, a protective element is formed on the rear surface side of the installing surface of the light emitting element. Thus, light emitted from the light emitting element is not obstructed by the protective element and the protective element can be formed without lowering the efficiency of light emission to make it possible to obtain a surface mounted light emitting device having superior reliability with a focus on low cost producibility.

Advantageous Effects of Invention

According to the present invention as described above, since a protective element is formed at least on the top surface side, on the back surface side, or inside of an insulating film, and the protective element is formed on the rear surface side of the installing surface of a light emitting element, light emitted from the light emitting element is not obstructed by the protective element and the protective element can be formed without lowering the efficiency of light emission as in conventional techniques to make it possible to obtain a surface mounted light emitting device having superior reliability with a focus on low cost producibility.

BRIEF DESCRIPTION OF THE DRAWINGS

FIG. 1(a) is a longitudinal sectional view thereof. FIG. 1(b) is a plan view seen from the top side thereof. FIG. 1(c) is a rear view thereof.

FIG. 2 is a diagram showing an example of a configuration of a light emitting device of Embodiment 2 of the present invention. FIG. 2(a) is a longitudinal sectional view thereof. FIG. 2(b) is a plan view seen from the top side thereof. FIG. 2(c) is a rear view thereof.

FIG. 3(a) is a plan view seen from the top side thereof. FIG. 3(b) is a rear view thereof.

FIG. 4(a) is a plan view seen from the top side thereof. FIG. 4(b) is a rear view thereof.

FIG. 5 is a diagram showing an example of a configuration of a light emitting device of Embodiment 5 of the present invention. FIG. 5(a) is a longitudinal sectional view thereof. FIG. 5(b) is a plan view seen from the top side thereof. FIG. 5(c) is a rear view thereof.

FIG. 6(a) is a longitudinal sectional view thereof. FIG. 6(b) is a plan view seen from the top side thereof. FIG. 6(c) is a rear view thereof.

Figure 1:
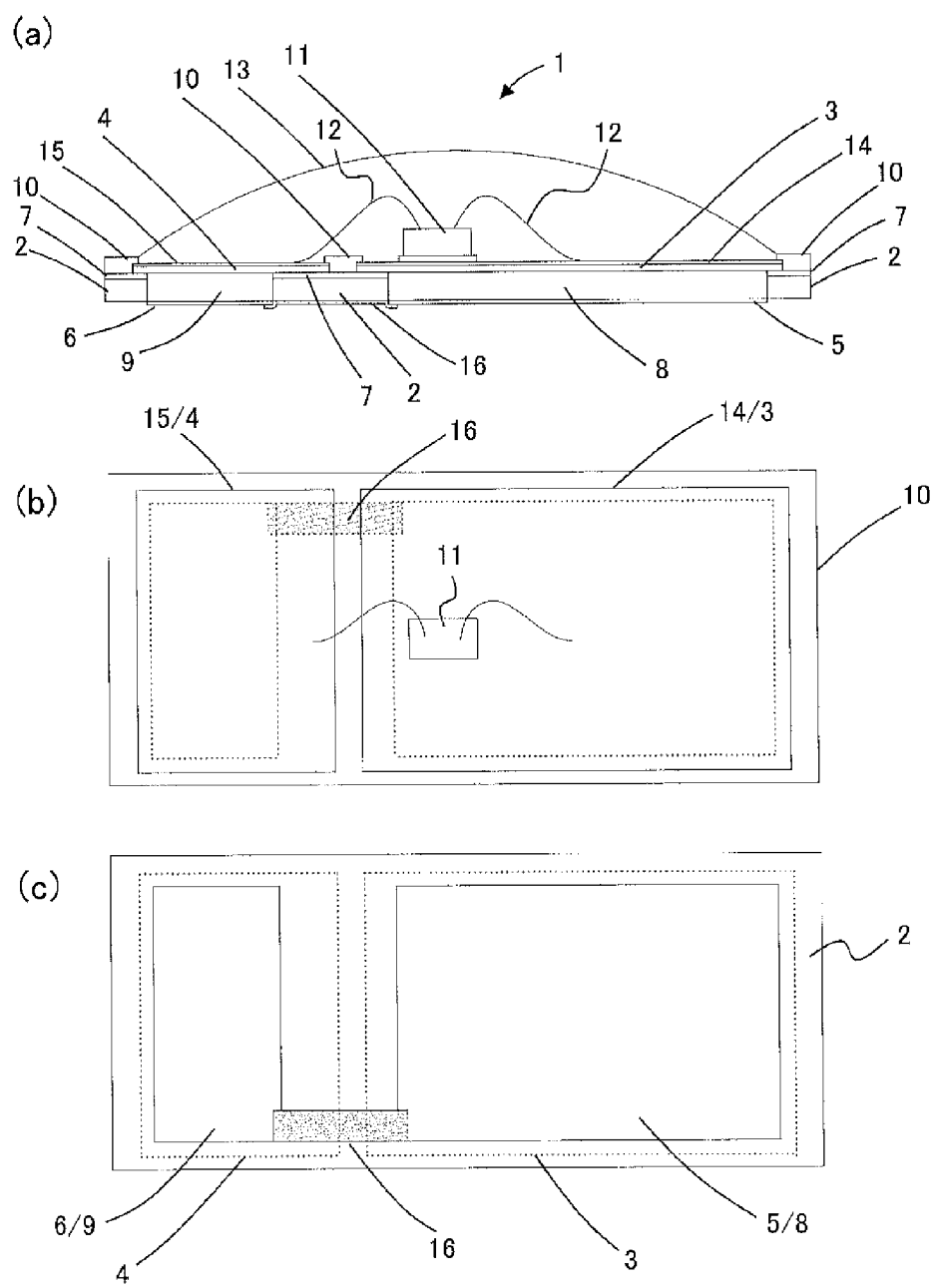
FIG. 1 is a diagram showing an example of a configuration of a light emitting device of Embodiment 1 of the present invention.

REFERENCE SIGNS LIST 1, 1A-1E light emitting device
2 insulation film
3, 4, 3B, 4B, 3C, 4C pair of land sections
5, 6, 5A, 6A, 5B, 6B, 5C, 6C pair of terminal sections for external connection
7 adhesive
8, 9, 8B, 9B, 8C, 9C penetrating conductor
10 white silicone resin
11 light emitting element
12 wire
13 phosphor-containing silicone resin
14, 15, 5A1, 5A2, 6A1, 6A2 plated layer
16, 16A-16D printed resistance

DESCRIPTION OF EMBODIMENTS

Hereinafter, Embodiments 1-6 of a surface mounted light emitting device using a TAB (tape-automated bonding) substrate as a film wiring substrate (flexible wiring substrate) will be explained in detail while referring to the Figures. In addition, from the standpoint of creating the Figures, the thickness, length, and the like of each constituent member in each Figure is not limited to the illustrated configuration.

Embodiment 1

FIG. 1 is a diagram showing an example of a configuration of a light emitting device of Embodiment 1 of the present invention. FIG. 1(a) is a longitudinal sectional view thereof. FIG. 1(b) is a plan view seen from the top side thereof. FIG. 1(c) is a rear view thereof.

As shown in FIGS. 1(a)-1(c), a light emitting device 1 of Embodiment 1 comprises a pair of land sections 3 and 4 consisting of a metal film fragment as two conductive regions provided to correspond to ± polarity on the top surface of an insulation film 2. The light emitting device comprises a pair of terminal sections 5 and 6 for external connection consisting of a metal film fragment on the bottom surface. Each of the land sections 3 and 4 is attached to the top surface of the insulation film 2 with an adhesive layer 7 interposed therebetween. Similarly, each of the terminal sections 5 and 6 is provided on the bottom surface of the insulation film 2. The land section 3 and the terminal section 5 face each other while sandwiching the insulation film 2 and are electrically connected by a penetrating conductor 8 that penetrates the insulation film 2. Similarly, the land section 4 and the terminal section 6 face each other while sandwiching the insulation film 2 and are electrically connected by a penetrating conductor 9 that penetrates the insulation film 2.

The pair of land sections 3 and 4 is electrically insulated and separated by a long and narrow space in a plan view between the land sections 3 and 4. Similarly, the terminal sections 5 and 6 constituting a pair of terminal sections are electrically insulated and separated by a long and narrow space between the terminal sections 5 and 6.

A white silicone resin 10 is formed in a dam shape in a space between the outer circumferences of the pair of land sections 3 and 4 so that, for example, edges of the pair of land sections 3 and 4 are covered and the top surface is slightly higher than the top surface of the pair of land sections 3 and 4.

In Embodiment 1, areas of the land sections 3 and 4 are configured so that, for example, the land section 3 is larger than the land section 4 and the substrate side of a wire bonding type light emitting element 11 (semiconductor light emitting element) is connected to the land section 3 by die bonding. The P electrode (anode) of the light emitting element 11 and the land section 4 as well as the N electrode of the light emitting element 11 and the land section 3 are each connected via a bonding wire 12.

A phosphor-containing silicone resin 13 for sealing the light emitting element 11 is formed in a dome shape on a region surrounded by the white silicone resin 10 formed on the outer circumferences of the pair of land sections 3 and 4.

The white silicone resin 10 is formed on the outer circumferences of the pair of land sections 3 and 4 and the space therebetween. The surface of the phosphor-containing silicone resin 13 for sealing the light emitting element 11 is formed in a dome shape on a region surrounded by the white silicone resin 10 formed on the outer circumferences of the pair of land sections 3 and 4.

In Embodiment 1, plated layers 14 and 15 applied with a nickel silver plating on a copper foil of the pair of land sections 3 and 4 are used as an example of a metal film fragment of the pair of land sections 3 and 4. A polyimide film with a film thickness of 0.05 mm is used as an example of the insulation film 2.

A printed resistance 16, as a protective element (printed resistance element), is formed on the back surface side of the insulation film 2 with a predetermined width to connect the terminal sections 5 and 6. Thereby, the printed resistance 16 is electrically connected in parallel between both electrodes of the light emitting element 11.

In this regard, in order to prevent surge from destroying the light emitting element 11 and to achieve an effect of measures against deterioration of the light emitting element 11 due to photovoltaic power, as well as to prevent forward direction leakage flowing through the printed resistance 16 (protective element) from affecting drive currents of the light emitting element 11, the value of resistance of the printed resistance 16 is desirably 1 MΩ to 10 GΩ.

The printed resistance 16 is formed by screen printing a paste containing a resistance component. The paste is comprised of ruthenium oxide (RuO2, ruthenium as conductive powder), a solidifying agent, a resin, and a solvent. The paste is creamy with high viscosity. The shape does not collapse even immediately after screen printing prior to baking.

In Embodiment 1, a polyimide film with a film thickness of 0.05 mm is used as the material for the insulation film 2. However, other than polyimide films, bismaleimide triazine resin based film or a liquid crystal polymer based film or the like may be used.

Further, the film thickness of the insulation film 2 is also not limited to 0.05 mm. The film thickness can be thinner than 0.05 mm for materials with greater strength. The film thickness can be made thicker within the range of thickness that can be readily cut with a splicer or a simple cutting tool.

In Embodiment 1, after a metal laminate film is formed on one surface of the insulation film 2 with the adhesive layer 7 interposed therebetween, unnecessary portions are removed to form the land sections 3 and 4. However, instead of this method of formation, a metal laminate film with pre-patterned land sections 3 and 4 may be attached to one surface of the insulation film 2.

Embodiment 1 explains a form (white-based light emitting device) which uses a blue-based light emitting diode as the light emitting device 11 that is sealed with the silicone resin 13 containing red phosphors and green phosphors. However, the present invention can be applied to light emitting devices other than white-based light emitting devices. Light emitting diodes with emitted color (emission wavelength) other than blue based color may be used as the light emitting element 11. Further, the silicon resin 13 may be used as a transparent sealing resin without including phosphors. Furthermore, phosphors other than red phosphors and green phosphors may be used as phosphors contained in the silicone resin 13, as a sealing resin. However, emission wavelengths of phosphors need to be longer wavelengths than the emission wavelength of the light emitting element 11.

Embodiment 1 explains a case of installing one light emitting element 11 in a single unit segment. However, a plurality of dice of the light emitting elements 11 may be installed in a single unit segment.

Further, Embodiment 1 explains a case of installing the same light emitting element 11 in each unit segment on a laminated substrate. However, different light emitting elements 11 (e.g., light emitting diodes with a different emission wavelength) may be installed between one unit segment and another unit segment on the same laminated substrate.

The shape and dimension of each part explained in Embodiment 1 is one example thereof. For example, the shape and dimension can be changed in accordance with the chip size or the like of the light emitting element 11. Further, the shape of the bottom surface of a sealing resin, silicone resin 13, is not limited to rectangular, square, and obround shapes. For example, the bottom surface shape may certainly be a circular or oval shape.

Thus, the light emitting device 1 of Embodiment 1 comprises the insulation film 2, an LED chip as the light emitting element 11, the printed resistance 16 as a protective element (printed resistance element), the white silicone resin layer 10, Ni+Ag plated layers 14 and 15, the silicone resin 13 as a phosphor-containing resin layer, land sections 3 and 4 (copper foil layer), and penetrating conductors 8 and 9.

Herein, in the light emitting device 1 of Embodiment 1, in addition to the penetrating conductors 8 and 9 being extendedly provided, the printed resistance 16, as a printed resistant element, is provided between conductors 8 and 9 on the back surface of the insulation film 2.

The manufacturing method of the light emitting device 1 of Embodiment 1 having the configuration described above will be described.

First, the insulation film 2 (polyimide) applied with the adhesive 7 on the surface is prepared.

Next, through holes (opening) for the penetrating conductors 8 and 9 are formed on the insulation film 2 applied with the adhesive 7.

Subsequently, copper foil layers (herein, copper foil layers prior to being the land sections 3 and 4) are formed on the side of the insulation film 2 where the adhesive 7 is applied.

The penetrating conductors 8 and 9 are then formed by filling the inside of the through holes (opening) thereof with copper plating.

Furthermore, photo etching is used on the copper foil layers to form the cathode land section 3 and the anode land section 4 in a predetermined shape.

Next, the Ni+Ag plated layers 14 and 15 and the pair of terminal sections 5 and 6 which is a Ni+Ag plated layer are formed on the land sections 3 and 4 and the penetrating conductors 8 and 9 that are connected to the land sections 3 and 4 formed on the top and bottom surfaces of the insulation film 2.

Subsequently, the white silicone resin layer 10 is formed on the top surface of the insulation film 2 except for the land sections 3 and 4.

In this manner, the penetrating conductors 8 and 9 that penetrate the main surface of the insulation film 2 and reach the back surface are formed to extend to the cathode land section 3 and the anode land section 4, respectively.

The strip-shaped printed resistance 16 with a predetermined width, as a protective element (printed resistance element), is formed to electrically connect the penetrating conductors 8 and 9 on the Ni+Ag plated layers (terminal sections 5 and 6) on the penetrating conductors 8 and 9.

Thereby, the printed resistance 16, as a printed resistance element, is formed by electrically connecting the penetrating conductors 8 and 9, that is, in parallel to the light emitting element 11.

Thus, both ends of the printed resistance 16, as a protective element, are electrically connected to the pair of land sections 3 and 4, which are installed with and electrically connected to the light emitting element 11.

In the light emitting device 1 of Embodiment 1, the printed resistance 16, as a printed resistance element, is arranged on the back surface of the insulation film 2. Thus, the printed resistance 16 would not obstruct light emission of the light emitting element 11 on the top surface side. In addition, an installable region of an LED chip, as the light emitting element 11, on the main surface side of the insulation film 2 expands to enable installing, for example, at least one LED chip. Thereby, a brighter light emitting device 1 can be made on the base material using the insulation film 2.

The printed resistance 16 used herein as a protective element (printed resistance element) is not a material with wettability to a brazing material. Thus, even if the light emitting device 1 is installed on the installation substrate, the brazing material would not wet the printed resistance 16, as a printed resistance element, to electrically connect the penetrating conductors 8 and 9 to form a brazing material portion that is in parallel to the printed resistance 16 as a protecting element (printed resistance element). However, when the printed resistance 16, as a protecting element (printed resistance element), uses a material with wettability to a brazing material, it is necessary to devise a cover on the printed resistance 16 as a protective layer (printed resistance element) with an insulation layer such as a dry film or a glass layer.

From the above, the light emitting device 1 of Embodiment 1 comprises the insulation film 2 (substrate or base material), the light emitting element 11 installed on the top surface side of the insulation film 2, and a protective element connected in parallel to the light emitting element 11, where the protective element is comprised of the printed resistance 16 and is formed on the back surface of the insulation film 2.

In this manner, arrangement of a protective element is not restricted by using the thin film printed resistance 16 with a predetermined width as a protective element. Since the arrangement is not restricted for the thin film printed resistance 16, electrical connection to a thin film metal layer is facilitated and all or part thereof (see the next Embodiment 2) is readily covered with a resin or the like. Thus, blocking/absorption of emitted light from the light emitting element 11 by a protective element is reduced.

Accordingly, blocking/absorption of light emitted externally from the light emitting element 11 is inhibited to allow obtaining emitted light with excellent luminance without inducing a reduction in external light emission of light output from the light emitting element 11.

In this regard, the printed resistance 16, as a protective element, is formed on the back surface to enable reduction in light absorbance of emitted light from the light emitting element 11 on the front side. Further, since the distance between the penetrating conductors 8 and 9 is long on the back surface, designing a large resistance value for the printed resistance 16, as a protective element, is facilitated. Furthermore, since a protective element is a thin film printed resistance 16, it can be formed at a low cost.

Since the thin film printed resistance 16, as a protective element, is formed on the back surface, the plan view shape of a sealing resin (containing phosphors), the phosphor-containing silicone resin 13, is not affected. Thus, changes in chromaticity or luminance are reduced.

Embodiment 2

In the above-described Embodiment 1, the printed resistance 16 was formed on the back surface of the insulation film 2 to expose the entire printed resistance 16. However, Embodiment 2 explains a case in which both ends of the printed resistance 16 are covered and protected with another conductive film.

FIG. 2 is a diagram showing an example of a configuration of a light emitting device of Embodiment 2 of the present invention. FIG. 2(a) is a longitudinal sectional view thereof. FIG. 2(b) is a plan view seen from the top side thereof. FIG. 2(c) is a rear view thereof. The members achieving the same working effect as the constituent members of FIG. 1 are explained while being assigned with the same reference numeral.

As shown in FIGS. 2(a)-2(c), a light emitting device 1A of Embodiment 2 comprises an insulation film 2, an LED chip as a light emitting element 11, a printed resistance 16A as a protective element (printed resistance element), a white silicone resin layer 10, Ni+Ag plated layers 14 and 15, terminal sections 5A and 6A consisting of Ni+Ag plated layers 5A1 and 5A2 and 6A1 and 6A2, a silicone resin 13 which is a phosphor-containing resin layer, and a pair of land sections 3 and 4 (copper foil layer). Herein, in addition to a cathode electrode (terminal section 5A) and anode electrode (terminal section 6A) extendedly provided, the printed resistance 16A is provided on the back surface of the insulation film 2.

The printed resistance 16A, as a protective element (printed resistance element), is formed on the back surface of the insulation film 2 prior to forming the cathode electrode (terminal section 5A) and the anode electrode (terminal section 6A).

Next, the land sections 3 and 4, and the Ni+Ag plated layers 14 and 15, 5A1 and 5A2, and 6A1 and 6A2 are formed on the top and back surfaces of the insulation film 2.

Subsequently, the white silicone resin layer 10 is formed on the top surface of the insulation film 2 except on the Ni+Ag plated layers 14 and 15.

The cathode land section 3 and the anode land section 4 are formed to extend to the cathode terminal section 5A and the anode terminal section 6A through the penetrating conductors 8 and 9 that penetrate the main surface of the insulation film 2 and reach the back surface, respectively.

After the printed resistance 16A, as a protective element (printed resistance element), is formed on the back surface of the insulation film 2, the cathode terminal section 5A and the anode terminal section 6A are formed to cover both end sides of the printed resistance 16A, as a protective element (printed resistance element). Thereby, the printed resistance 16A, as a protective element (printed resistance element), is formed between the cathode terminal section 5A and the anode terminal section 6A.

Thereby, an LED chip, as the light emitting element 11 and the printed resistance 16A, as a protective element, are electrically connected in parallel.

According to Embodiment 2 from the above, since both ends of the printed resistance 16A, as a protective element, are partially (both ends) covered by the anode terminal section 5A and the cathode terminal section 6A, detrimental effect to the characteristic (herein, the resistance value) of a protective element can be reduced because the printed resistance 16A, as the protective element, is less likely to be damaged.

In the light emitting device 1A of Embodiment 2, the printed resistance 16A, as a protective element (printed resistance element), is arranged on the back surface of the insulation film 2. Thus, an installable region of an LED chip, as the light emitting element 11, on the main surface of the insulation film 2 expands to enable installing, for example, at least one LED chip.

Thereby, a brighter light emitting device 1 can be made on the base material using the insulation film 2.

The printed resistance 16A used herein as a protective element (printed resistance element) is not a material with wettability to a brazing material. Thus, even if the light emitting device 1A is installed on the installation substrate, the brazing material would not wet the printed resistance 16A, as a protective element (printed resistance element), to electrically connect the cathode terminal section 5A and the anode terminal section 6A to form a brazing material portion that is in parallel to the printed resistance 16A, as a protecting element (printed resistance element)

However, when the printed resistance 16A, as a protecting element (printed resistance element), uses a material with wettability to a brazing material, it is necessary to devise a cover on the printed resistance 16A as a protective layer (printed resistance element) with an insulation layer such as a dry film or a glass layer.

Embodiment 2 explains a case in which both ends of the printed resistance 16 on the back surface of the insulation film 2 are covered and protected with the cathode terminal section 5A and the anode terminal section 6A as another conductive film. However, in addition thereto, a protective film may be formed on the exposed printed resistance 16, cathode terminal section 5A, and anode terminal section 6A to completely cover and protect the printed resistance 16.

Embodiment 3

Embodiment 3 explains a case in which opposing sides of two conductive regions corresponding to ± polarity are formed in concave-convex shapes in a plan view in order to prevent a device from folding.

Figure 3:
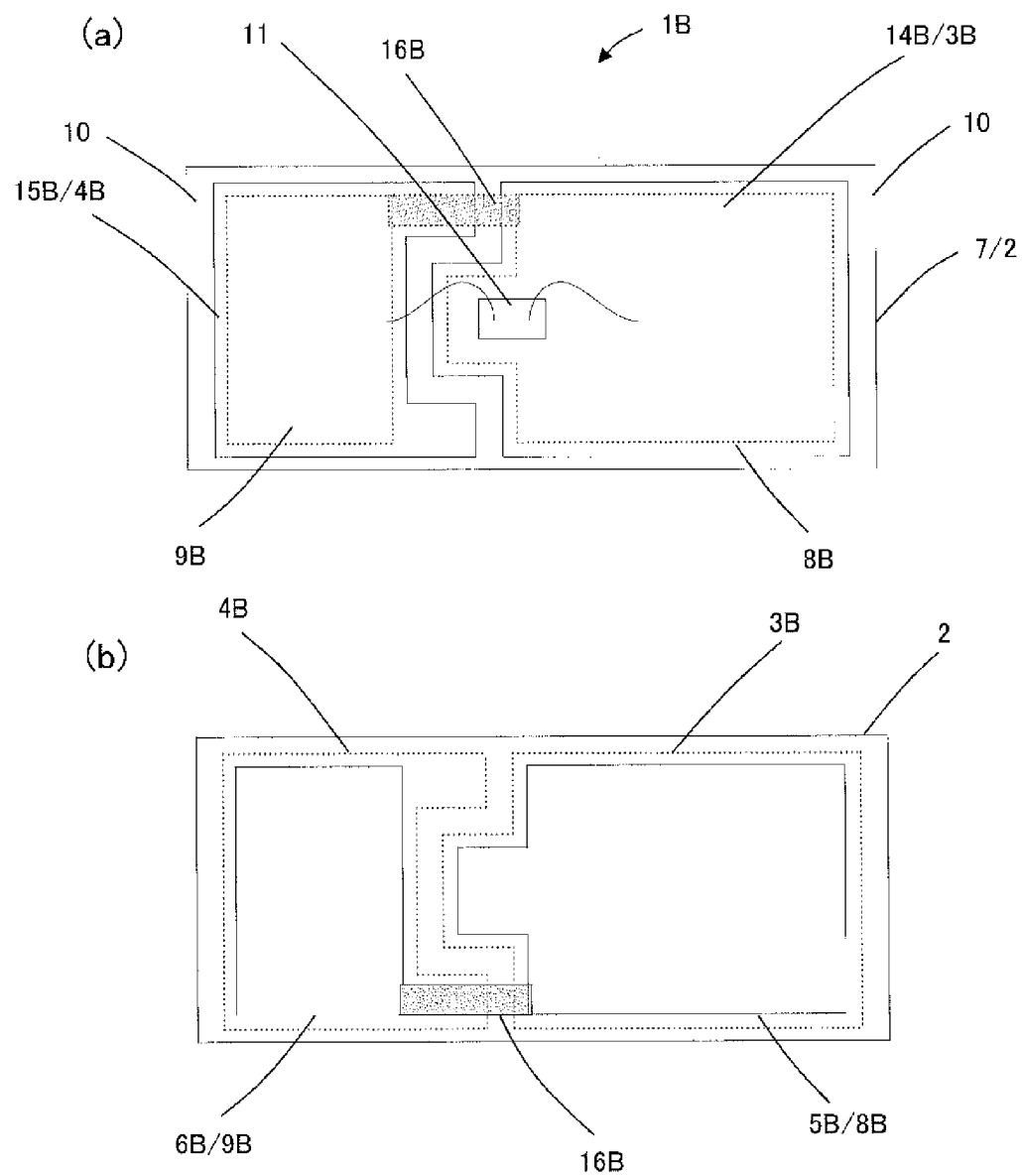
FIG. 3 is a diagram showing an example of a configuration of a light emitting device of Embodiment 3 of the present invention.

FIG. 3 is a diagram showing an example of a configuration of a light emitting device of Embodiment 3 of the present invention. FIG. 3(a) is a plan view seen from the top side thereof. FIG. 3(b) is a rear view thereof. The members achieving the same working effect as the constituent members of FIG. 1 are explained while being assigned with the same reference numeral.

As shown in FIGS. 3(a) and 3(b), a light emitting device 1B of Embodiment 3 comprises an insulation film 2 with an adhesive 7, an LED chip as a light emitting element 11, a printed resistance 16B as a protective element (printed resistance element), a white silicone resin layer 10, Ni+Ag plated layers 14B and 15B, a pair of terminal sections 5B and 6B consisting of Ni+Ag plated layers, a silicone resin 13 as a phosphor-containing resin layer, a pair of land sections 3B and 4B (copper foil layer), and penetrating conductors 8B and 9B.

In this regard, the shapes of the land sections 3B and 4B are different from the above-described Embodiments 1 and 2 such that the shapes of opposing sides are convex-concave shapes in a plan view in order to reinforce insulation film strength. In sum, shapes of the opposing sides of the land sections 3B and 4B are formed in at least concave-convex surface shapes such that a convex portion and a concave portion enter and fit each other. Film strength is enhanced by shaping the center of the land section 3B in a convex shape in a plan view and the center of the land section 4B in a convex shape in a plan view, which fit with each other.

In the light emitting device 1B, in addition to the penetrating conductors 8B and 9B being extendedly provided, the printed resistance 16B, as a protective element (printed resistance element), is provided to connect the penetrating conductors 8B and 9B (pair of terminal sections 5B and 6B therebelow) on the back surface of the insulation film 2.

The strength of the insulation film 2 is reinforced by the concave-convex shapes of the opposing sides of the land sections 3B and 4B. However, it is difficult to provide a protective element between the land sections 3B and 4B on the top surface because the distance therebetween is too short. For this reason, since there is a sufficient distance between the penetrating conductors 8B and 9B on the back surface thereof (between the pair of terminal sections 5B and 6B therebelow in actuality), the printed resistance 16B is provided between the penetrating conductors 8B and 9B (pair of terminal sections 5B and 6B therebelow in actuality) on the back surface of the insulation film 2 so that both ends of the printed resistance is connected.

Furthermore, the strength of the insulation film 2 can be further enhanced by providing the printed resistance 16B to bridge the penetrating conductors 8B and 9B (pair of terminal sections 5B and 6B therebelow in actuality).

In sum, the strength of the insulation film 2 can be enhanced by shaping the tip side of the land section 3B/Ni+Ag plated layer 14B in a convex shape in a plan view and shaping the tip side of the opposing land section 4B/Ni+Ag plated layer 15B in a concave shape in a plan view so that the convex shape portion in a plan view and the concave shape portion in a plan view enter and fit each other while being spaced equidistantly.

However, in this case, the distance is close between the land section 3B/Ni+Ag plated layer 14B and the land section 4B/Ni+Ag plated layer 15B. Thus, it is difficult to design a resistance value of the printed resistance 16B as a protective element (especially, when a large resistance value is required).

For this reason, designing of the resistance value of the printed resistance 16B, as a protective element, is facilitated because the distance is longer between penetrating conductor 8B/Ni+Ag plated layer 5B and the penetrating conductor 9B/Ni+Ag plated layer 6B on the back surface side instead of on the surface on the same side as the land section 3B/Ni+Ag plated layer 14B and the land section 4B/Ni+Ag plated layer 15B.

Furthermore, since the printed resistance 16B (herein, ruthenium oxide), as a protective element, is hard, the strength of the insulation film 2 would be further reinforced.

Thus, since the light emitting device 1B is installed with the printed resistance 16B as a protective element, which enhances the film strength of the insulation film 2, a highly reliable light emitting device 1B is obtained.

The printed resistance 16B, which is a protective element, is connected in parallel to an LED chip as the light emitting element 11. The printed resistance 16B is provided at a location other than the top surface side of a TAB substrate having the insulation film 2 as the base material. That is, the printed resistance 16B is provided on the back surface of the insulation film 2. The printed resistance 16B is configured as a strip-shaped thin film printed resistance so that the arrangement thereof is not restricted.

In this manner, since the printed resistance 16B is a thin film printed resistance and the arrangement thereof is not restricted, electrical connection with a thin film metal layer is facilitated and can be readily covered with a resin or the like. Thus, blocking/absorption of emitted light from an LED chip, as the semiconductor light emitting element 11, by the printed resistance 16B is reduced. Accordingly, blocking/absorption of light emitted externally from an LED chip, as a semiconductor light emitting element 11, is inhibited to allow obtaining emitted light with excellent luminance without inducing a reduction in light output. Further, the light emitting device 1B can be formed at a low cost.

Embodiment 4

Embodiment 4 explains a case in which opposing sides of two conductive regions corresponding to ± polarity are formed in L/L shapes in a plan view in order to prevent a device from folding.

Figure 4:
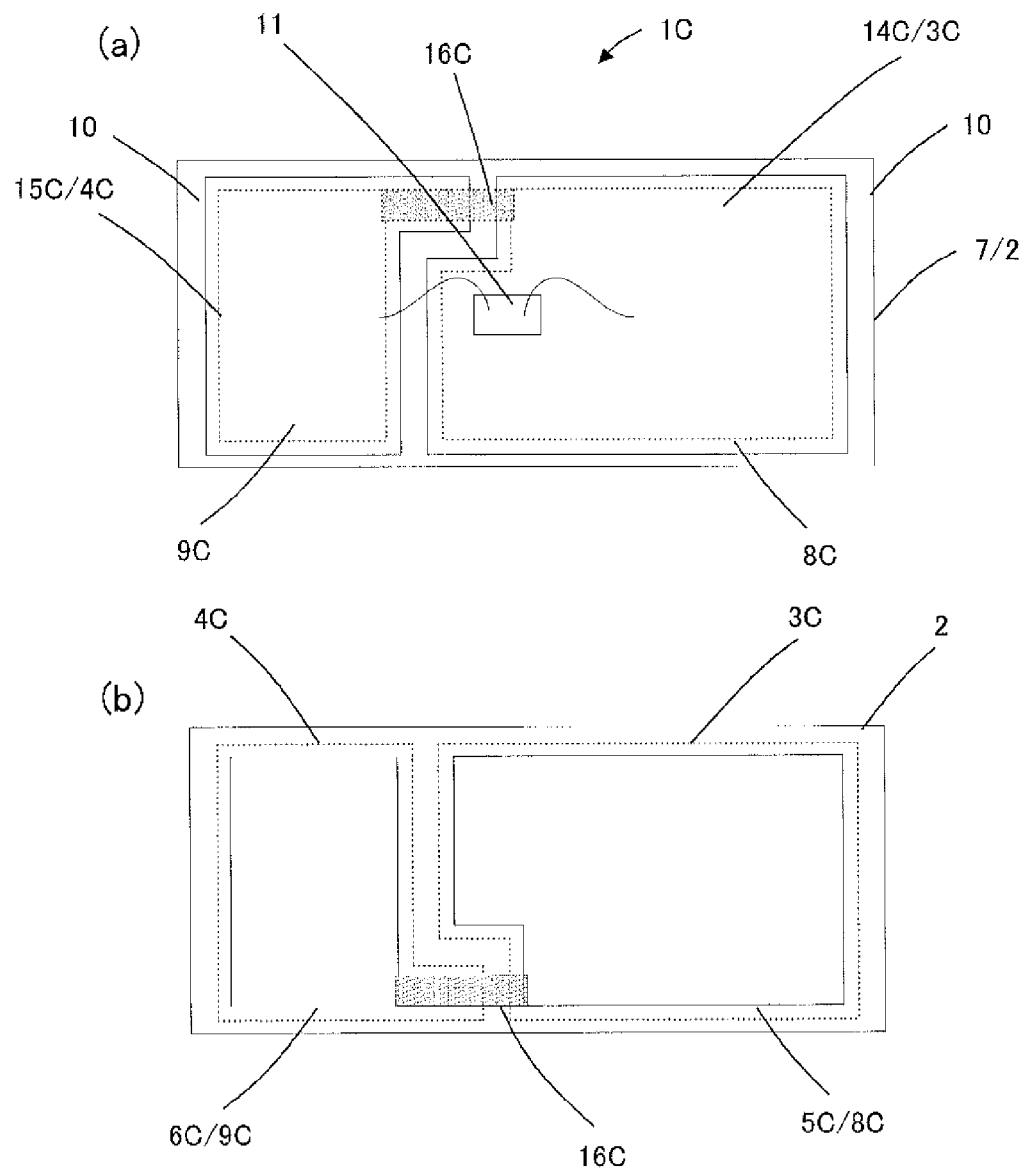
FIG. 4 is a diagram showing an example of a configuration of a light emitting device of Embodiment 4 of the present invention.

FIG. 4 is a diagram showing an example of a configuration of a light emitting device of Embodiment 4 of the present invention. FIG. 4(a) is a plan view seen from the top side thereof. FIG. 4(b) is a rear view thereof. The members achieving the same working effect as the constituent members of FIG. 1 are explained while being assigned with the same reference numeral.

As shown in FIGS. 4(a) and 4(b), a light emitting device 1C of Embodiment 4 comprises an insulation film 2 with an adhesive 7, an LED chip as a semiconductor light emitting element 11, a printed resistance 16C as a protective element (printed resistance element), a white silicone resin layer 10, Ni+Ag plated layers 14C and 15C, a pair of terminal sections 5C and 6C consisting of Ni+Ag plated layers, a silicone resin 13 as a phosphor-containing resin layer, a pair of land sections 3C and 4C (copper foil layer), and penetrating conductors 8C and 9C.

In this regard, shapes of opposing sides of the pair of land sections 3C and 4C are different from the above-described Embodiment 3 in order to reinforce insulation film strength such that the tip sections enter and fit each other while being spaced equidistantly as L/L shapes in a plan view.

In sum, a protruding high edge side of the land section 3C with one of the L shapes in a plan view is positioned to enter a recessed low edge side of the land section 4C with the other L shape in a plan view. In addition, a protruding high edge side of the land section 4C with the other L shape in a plan view is positioned to enter a recessed low edge side of the land section 3C with one of the L shapes in a plan view. It is less likely to fold and the film strength is enhanced by fitting the land sections 3C and 4C with each other as L/L shapes in a plan view.

For the light emitting device 1C, in addition to the penetrating electrodes 8C and 9C being extendedly provided, the printed resistance 16C, as a protective element (printed resistance element), is provided on the back surface of the insulation film 2.

In this manner, the strength of the insulation film 2 is reinforced by the L/L shapes of the pair of land sections 3C and 4C (copper foil layer) in plan view. However, it is difficult to provide the printed resistance 16C, as a protective element, between the land sections 3C and 4C on the top surface of the insulation film 2.

Thus, the printed resistance 16C is provided on the back surface of the insulation film 2. Furthermore, the strength of the insulation film 2 would also be enhanced by providing the printed resistance 16C between the penetrating conductors 8C and 9C (between the pair of terminal sections 5C and 6C therebelow in actuality).

In sum, the strength of the insulation film 2 can be enhanced by shaping the tip side of the land section 3C/Ni+Ag plated layer 14C in an L shape and shaping the tip side of the opposing land section 4C/Ni+Ag plated layer 15C in an L shape so as to fit each other.

However, in this case, the distance is close between the land section 3C/Ni+Ag plated layer 14C and the land section 4C/Ni+Ag plated layer 15C. Thus, it is difficult to design a resistance value of the printed resistance 16C as a protective element (especially, when a large resistance value is required).

For this reason, designing of the resistance value of the printed resistance 16C, as a protective element, is facilitated because the distance is longer between penetrating conductor 8C/Ni+Ag plated layer terminal section 5C and the penetrating conductor 9C/Ni+Ag plated layer terminal section 6C on the back surface side instead of on the surface on the same side as the land section 3C/Ni+Ag plated layer 14C and the land section 4C/Ni+Ag plated layer 15C.

Furthermore, since the printed resistance 16C (herein, ruthenium oxide), as a protective element, is hard, the strength of the insulation film 2 would be further reinforced.

Thus, since the light emitting device 1C is installed with the printed resistance 16C as a protective element, which enhances the film strength of the insulation film 2, a highly reliable light emitting device 1C is obtained.

Embodiment 5

The above-described Embodiments 1-4 explain a case in which a protective element (printed resistance element) is provided on the back surface of the insulation film 2. However, Embodiment 5 explains a case in which a protective element (printed resistance element) is provided on the top surface of an insulation film 2.

FIG. 5 is a diagram showing an example of a configuration of a light emitting device of Embodiment 5 of the present invention. FIG. 5(a) is a longitudinal sectional view thereof. FIG. 5(b) is a plan view seen from the top side thereof. FIG. 5(c) is a rear view thereof. The members achieving the same working effect as the constituent members of FIG. 1 are explained while being assigned with the same reference numeral.

As shown in FIGS. 5(a) and 5(b), a light emitting device 1D of Embodiment 5 comprises an insulation film 2, an LED chip as a semiconductor light emitting element 11, a printed resistance 16D as a protective element (printed resistance element), a white silicone resin layer 10, Ni+Ag plated layers 14 and 15, a pair of terminal sections 5 and 6 consisting of Ni+Ag plated layers, a silicone resin 13 as a phosphor-containing resin layer, a pair of land sections 3 and 4, and penetrating conductors 8 and 9.

Herein, the printed resistance 16D, as a printed resistance element, is provided on an adhesive layer 7 on the top surface of the insulation film 2 in the light emitting device 1D. The printed resistance 160 is formed on the top surface of the insulation film 2 prior to forming the cathode land section 3 and the anode land section 4. Next, the pair of land sections 3 and 4 is formed on the top surface of the insulation film 2.

Further, the Ni Ag plated layers 14 and 15 and the pair of terminal sections 5 and 6 consisting of Ni+Ag plated layers are formed on the pair of land sections 3 and 4 and the penetrating conductors 8 and 9.

Furthermore, the white silicone resin layer 10 is formed on the top surface of the insulation film 2.

Thereby, the printed resistance 16D, as a printed resistance element, is formed between the cathode land section 3 and the anode land section 4. The cathode land section 3 and the anode land section 4 are formed to extend to the penetrating conductors 8 and 9, respectively, that penetrate the main surface of the insulation film 2 and reach the back surface.

In the light emitting device 1D, the printed resistance 16D, as a protective element (printed resistance element), is arranged on the top surface side of the insulation film 2 and the back surface side of the cathode land section 3 and the anode land section 4. Thus, an installable region of an LED chip on the main, surface side of the cathode land section 3 expands to enable installing, for example, at least one LED chip.

Thereby, a brighter light emitting device 10 can be made on the basic material using the insulation film 2.

Embodiment 6

The above-described Embodiments 1-4 explain a case in which a protective element (printed resistance element) is provided on the back surface of the insulation film 2. Embodiment 5 explains a case in which a printed resistance element is provided on the top surface of an insulation film 2. Embodiment 6 explains a case in which a light emitting element 11 is covered by a phosphor-containing resin layer (or translucent resin layer) formed on the top surface side of an insulation film 2 and a protective element (printed resistance element) is formed on the top surface side of the insulation film 2 and on the outer side in a plan view of the phosphor-containing resin layer (or translucent resin layer).

Figure 6:
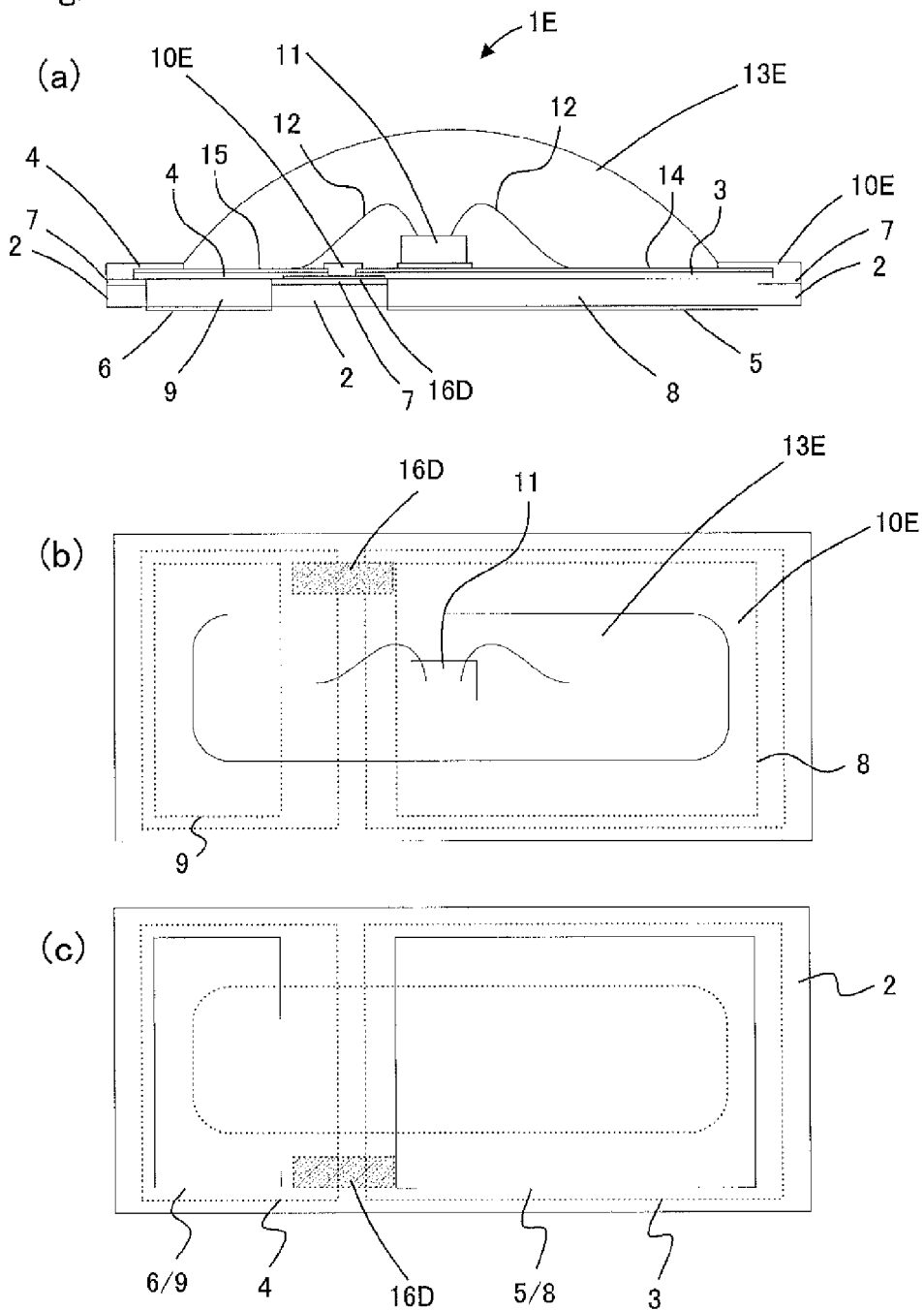
FIG. 6 is a diagram showing an example of a configuration of a light emitting device of Embodiment 6 of the present invention.
Figure 7:
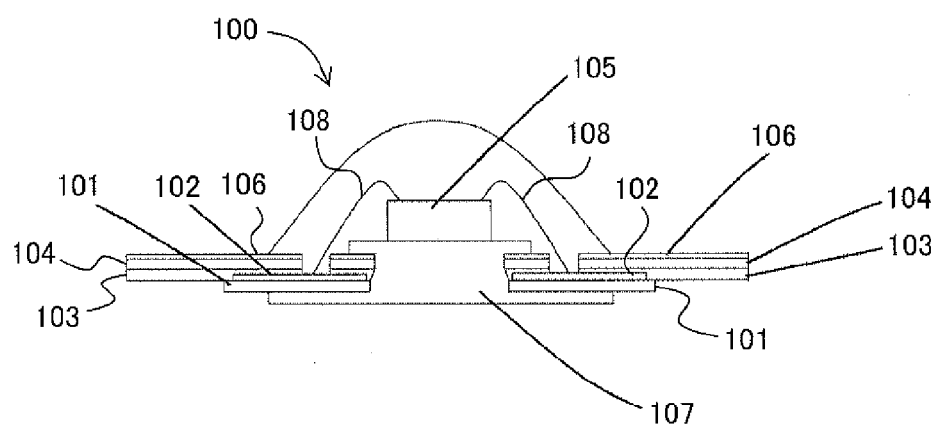
FIG. 7 is a longitudinal sectional view showing an example of a configuration of a conventional LED illumination module disclosed in Patent Literature 1.
Figure 8:
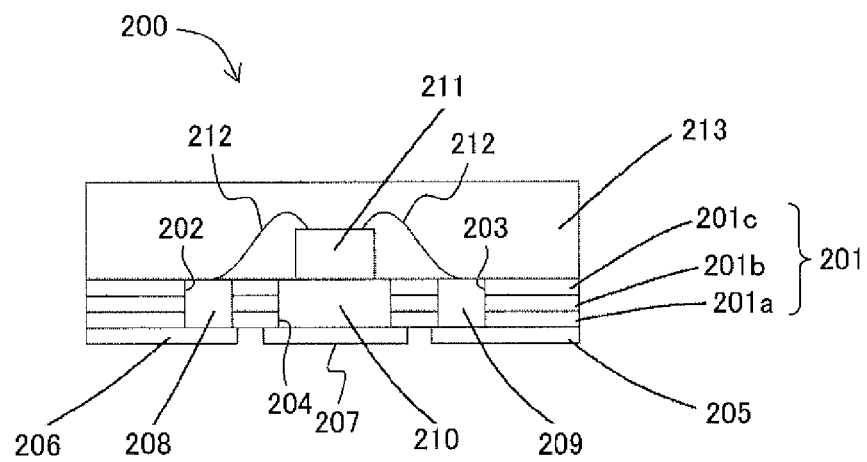
FIG. 8 is a longitudinal sectional view showing an example of a configuration of a conventional LED illumination module disclosed in Patent Literature 2.

FIG. 6 is a diagram showing an example of a configuration of a light emitting device of Embodiment 6 of the present invention. FIG. 6(a) is a longitudinal sectional view thereof. FIG. 6(b) is a plan view seen from the top side thereof. FIG. 6(c) is a rear view thereof. The members achieving the same working effect as the constituent members of FIG. 1 or 5 are explained while being assigned with the same reference numeral.

As shown in FIGS. 6(a) and 6(b), a light emitting device 1E of Embodiment 6 comprises an insulation film 2, an LED chip as a light emitting element 11, a printed resistance 16D as a protective element (printed resistance element), a white silicone resin layer 10, Ni+Ag plated layers 14 and 15, terminal sections 5 and 6 consisting of Ni+Ag plated layers, a phosphor-containing resin layer 13E, a pair of land sections 3 and 4, and penetrating conductors 8 and 9.

The cathode terminal section 5 and the anode terminal section 6 are extendedly provided on the back surface of the insulation film 2. Herein, in the light emitting device 1E, the printed resistance 16D, as a protective element (printed resistance element), is provided on an adhesive layer 7 on the top surface of the insulation film 2.

The printed resistance 16D is formed on the top surface of the insulation film 2 prior to forming the cathode land section 3 and the anode land section 4.

Next, the pair of land sections 3 and 4 is formed on the top surface of the insulation film 2 so as to overlap both ends of the printed resistance 16D.

Further, the Ni+Ag plated layers 14 and 15 and the pair of terminal sections 5 and 6 consisting of Ni+Ag plated layers are formed on the pair of land sections 3 and 4 and the penetrating conductors 8 and 9.

Furthermore, the white silicone resin layer 10 is formed on the top surface of the insulation film 2 except the pair of land sections 3 and 4.

Herein, the shape of the bottom surface of the phosphor-containing resin layer 13E is formed in an obround shape.

After the printed resistance 16D, as a protective element (printed resistance element), is formed, the cathode land section 3 and the anode land section 4 are formed to cover each end of the printed resistance 16D.

Thereby, the printed resistance 16D is formed between the cathode land section 3 and the anode land section 4. The cathode land section 3 and the anode land section 4 are formed to extend to the penetrating conductors 8 and 9, respectively, that penetrate the main surface of the insulation film 2 and reach the back surface.

Thereby, a brighter light emitting device 1E can be made on the base material using the insulation film 2. The shape of the bottom surface of the phosphor-containing resin layer 13E is formed herein in an obround shape, but the shape may be a circular, oval, rectangular, or square shape.

In Embodiment 6, the light emitting element 11 is covered by the phosphor-containing resin layer 13E formed on the top surface side of the insulation film 2, and the printed resistance 16D is formed on the top surface side of the insulation film 2 and on the outer side in plan view of the phosphor-containing resin layer 13E. The surface of the phosphor-containing resin layer 13E is formed in a dome shape.

According to the above-described Embodiments 1-6 from the above, since for example the printed resistance 16, as a protective element, is formed on at least one of the top surface side, the back surface side, and the inside of the insulating film 2 and, for example, the printed resistance 16, as a protective element, is formed on the rear surface side of the installation surface of the light emitting element 11, light emitted from the light emitting element 11 is not obstructed due to light blocking, light absorption or the like by, for example, the printed resistance 16, as a protective element. In addition, for example, the printed resistance 16, as a protective element, can be formed without lowering the efficiency of light emission from the light emitting element 11, as in the conventional technique, to make it possible to obtain a surface mounted light emitting device having superior reliability with a focus on low cost producibility.

The above-described Embodiments 1-6 have two conductive regions (e.g., pair of land sections 3 and 4) provided to correspond to ± polarity on the insulation film 2, the light emitting element 11 electrically connected to and installed on the top surface side of the two conductive regions, and a protective element (e.g., printed resistance 16) connected in parallel to the light emitting element 11, where the protective element is formed on the rear surface side of the installation surface of the light emitting element 11 and on the top surface side or back surface side of the insulation film 2. However, the present invention is not limited thereto. A protective element may be provided inside the insulation film 2. For example, the insulation film 2 may have a bilayer structure and a protective element may be provided therebetween. In this case, both edges of the protective element only needs to be electrically connected to the penetrating conductors 8 and 9 or the like.

Thus, the protective element (e.g., printed resistance 16) is on the rear surface side of the installation surface of the light emitting element 11 and is formed on at least one of the top surface side, the back surface side, and the inside of the insulating film 2. In sum, the protective element (e.g., printed resistance 16) may be formed not only on the top surface side, but also on the back surface side of the insulation film 2.

In the above-described Embodiments 1-6, a protective element is constituted by a printed resistance as a thin film resistance. However, the protective element is not limited thereto and may be another thin film resistance other than a printed resistance. Thin film resistances are resistors with a predetermined width, predetermined length and a predetermined film thickness.

Although detailed explanations were not provided, there are cases in the above-described Embodiments 1-6 where a phosphor-containing resin layer is further covered with a translucent resin layer. Thus, the light emitting element 11 is covered by at least one of a translucent resin layer and a phosphor-containing resin layer (phosphor-containing silicon resin 13) formed on the top surface side of the insulation film 2. One of the printed resistances 16 and 16A-16D, as a protective element is formed on the outer side in a plan view of at least one of the phosphor-containing resin layer (phosphor-containing silicon resin 13) and translucent resin layer on the top surface side or back surface side of the insulation film 2. Further, the surface of at least one of the phosphor-containing resin layer (phosphor-containing silicon resin 13) and translucent resin layer is formed in a dome shape.

Embodiment 3, although described above, is further explained; concave-convex shapes in a plan view for preventing a device from folding are formed so that a convex portion and a concave portion in a plan view of opposing sides of two conductive regions fit while being spaced at a predetermined distance. Further, Embodiment 4, although described above, is further explained; L/L shapes in a plan view (L and inverse L shapes in a plan view) for preventing a device from folding are formed so that opposing sides of a pair of land sections, as two conductive regions, oppose each other in the L shape in a plan view and inverse L shape in a plan view that enter each other while being spaced at a predetermined insulation distance. At least one of the concave-convex shapes in a plan view and L/inverse L shapes in a plan view for preventing a device from folding are used in the light emitting device of the present invention. For example, concave-convex shapes in a plan view and L/L shapes in a plan view (L and inverse L shapes in a plan view) can be consecutively formed and used together.

The printed resistances 16B and 16C, as a protective element, of the above-described Embodiments 3 and 4 are explained using the printed resistance 16, as a protective element, of the above-described Embodiment 1 as an example. However, the present invention is not limited thereto. The printed resistance 16A and/or printed resistance 16D, as a protective element, of the above-described Embodiments 2 and 5 can be used as the printed resistances 16B and 16C, as a protective element, of the above-described Embodiments 3 and 4. In addition, a printed resistance formed between two insulation films 2 (inside the insulation film 2) can also be used.

Both edges of the printed resistance 16A are covered by the anode terminal section 5A and the cathode terminal section 6A. Further, the printed resistance 16D, as a printed resistance element, is provided on the adhesive layer 7 on the top surface of the insulation film 2.

Although the relationship among one another was not explained in detail in the above-described Embodiments 1-6, as a protective element, each of the printed resistance 16 of the above-described Embodiment 1 formed on the back side of the insulation film 2, the printed resistance 16A of the above-described Embodiment 2, which is formed on the back side of the insulation film 2 while both edges are covered, the printed resistance 16D of the above-described Embodiment 5 formed on the top surface side of the insulation film 2, and a printed resistance formed between two insulation films 2 (inside the insulation film 2) is on the rear surface side of the installation surface of the light emitting element 11, and these protective elements only need to be formed on at least one of the top surface side, the back surface side, and the inside of the insulation film 2.

As described above, the present invention is exemplified by the use of its preferred Embodiments 1 to 6 of the present invention. However, the present invention should not be interpreted solely based on Embodiments 1 to 6. It is understood that the scope of the present invention should be interpreted solely based on the scope of the claims. It is also understood that those skilled in the art can implement equivalent scope of technology, based on the description of the present invention and common knowledge from the description of the detailed preferred Embodiments 1 to 6 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention relates to a surface mounted light emitting device and a manufacturing method thereof. In the field of a surface mounted light emitting device focused on low cost producibility in particular, since a protective element is formed on at least the top surface side, the back surface side, or the inside of an insulating film and the protective element is formed on the rear surface side of the installation surface of a light emitting element, light emitted from the light emitting element is not obstructed by the protective element. In addition, the protective element can be formed without lowering the efficiency of light emission from the light emitting element as in the conventional techniques to make it possible to obtain a surface mounted light emitting device having superior reliability with a focus on low cost producibility.

The invention claimed is:

1. A light emitting device comprising two conductive regions provided to correspond to ±polarity on an insulation film, a light emitting element installed on a top surface side of the two conductive regions and electrically connected to the two conductive regions, and a protective element connected in parallel to the light emitting element, wherein the two conductive regions are spaced and insulated from each other while step sections in a plan view are provided on opposing sides of the two conductive regions, and wherein the protective element is electrically connected between the step sections of the two conductive regions and the step sections have at least one of concave-convex shapes in a plan view for preventing the device from folding and L/L shapes in a plan view for preventing the device from folding.

2. The light emitting device of claim 1, wherein the concave-convex shapes in a plan view are formed so that opposing sides of the two conductive regions fit while being spaced at a predetermined distance.

3. The light emitting device of claim 1, wherein the L/L shapes in a plan view are formed so that opposing sides of the two conductive regions enter each other while being spaced at a predetermined distance.

4. The light emitting device of claim 1, wherein the protective element is comprised of a printed resistor or a thin film resistor.

5. The light emitting device of claim 4, wherein the protective element is formed on a top surface or a back surface of the insulation film.

6. The light emitting device of claim 4, wherein the protective element is formed on an adhesive layer formed on the insulation film.

7. The light emitting element of claim 4, wherein the protective element is electrically connected to a pair of terminal sections that are electrically connected to the two conductive regions.

8. The light emitting device of claim 7, wherein the protective element is formed between the pair of terminal sections, including on top of the pair of terminal sections.

9. The light emitting device of claim 7, wherein each of the pair of terminal sections is formed on each of both ends of the protective element to protect the protective element.

10. The light emitting device of claim 4, wherein the light emitting element is covered by at least one of a translucent resin layer and a phosphor-containing resin layer formed on the top surface side of the insulation film, and the protective element is formed on the top surface side or back surface side of the insulation film and on an outer side in a plan view of at least one of the phosphor-containing resin layer and the translucent resin layer.

11. A light emitting device comprising:
an insulation film comprising a top surface and a bottom surface;
two conductive regions provided on the top surface of the insulation film in correspondence with a positive polarity and a negative polarity, respectively;
a light emitting element installed on a top surface side of at least one of the two conductive regions and electrically connected to the two conductive regions;
a protective element connected in parallel to the light emitting element; and
a pair of terminal sections provided on the bottom surface of the insulation film and electrically connected to the two conductive regions, respectively;
wherein the two conductive regions are spaced and insulated from each other while step sections in a plan view are provided on opposing sides of the two conductive regions,
wherein the pair of terminal sections comprise shapes corresponding to shapes of the respective conductive regions except that one of the pair of terminal sections has no step section corresponding to that of the conductive region to which the one of the pair of terminal sections is electrically connected, and
wherein the protective element is provided on the back surface side of the insulation film and electrically connected between the pair of terminal sections.

12. The light emitting device of claim 11, wherein the step sections have at least one of concave-convex shapes in a plan view for preventing the device from folding and L/L shapes in a plan view for preventing the device from folding.

13. The light emitting device of claim 12, wherein the concave-convex shapes in a plan view are formed so that opposing sides of the two conductive regions fit while being spaced at a predetermined distance.

14. The light emitting device of claim 12, wherein the L/L shapes in a plan view are formed so that opposing sides of the two conductive regions enter each other while being spaced at a predetermined distance.

15. The light emitting device of claim 11, wherein the protective element is comprised of a printed resistor or a thin film resistor.

16. The light emitting device of claim 15, wherein the protective element is formed on a top surface or a back surface of the insulation film.

17. The light emitting device of claim 15, wherein the protective element is formed on an adhesive layer formed on the insulation film.

18. The light emitting device of claim 17, wherein the protective element is electrically connected to a pair of terminal sections that are electrically connected to the two conductive regions.

19. The light emitting device of claim 15, wherein the protective element is formed between the pair of terminal sections, including on top of the pair of terminal sections.

20. The light emitting device of claim 19, wherein each of the pair of terminal sections is formed on each of both ends of the protective element to protect the protective element.

* * * * *